(12) United States Patent
Weston et al.

(10) Patent No.: US 7,764,528 B2
(45) Date of Patent: Jul. 27, 2010

(54) AC TO DC CONVERSION CIRCUIT

(75) Inventors: Lance Weston, East Northport, NY (US); Mark H. Schmidt, West Islip, NY (US); Tony T. Li, Roslyn Heights, NY (US)

(73) Assignee: Honeywell International Inc., Morristown, NJ (US)

( * ) Notice: Subject to any disclaimer, the term of this patent is extended or adjusted under 35 U.S.C. 154(b) by 511 days.

(21) Appl. No.: 11/862,066

(22) Filed: Sep. 26, 2007

(65) Prior Publication Data
US 2009/0080224 A1   Mar. 26, 2009

(51) Int. Cl.
*H02M 7/02*   (2006.01)
(52) U.S. Cl. ....................... 363/125; 327/104
(58) Field of Classification Search .......... 363/125, 363/127; 327/104, 309, 318, 321
See application file for complete search history.

(56) References Cited

U.S. PATENT DOCUMENTS

| | | | |
|---|---|---|---|
| 3,723,845 A | | 3/1973 | Duckworth |
| 3,936,720 A | * | 2/1976 | Von Recklinghausen .... 330/259 |
| 4,030,016 A | * | 6/1977 | Marriott ..................... 363/126 |
| 4,109,308 A | | 8/1978 | Rödel |
| 4,382,159 A | * | 5/1983 | Bowditch ................... 381/120 |
| 4,704,545 A | | 11/1987 | Tanaka et al. |
| 5,579,214 A | * | 11/1996 | Kitani et al. .................. 363/44 |
| 5,642,074 A | * | 6/1997 | Ghaffaripour et al. ......... 330/51 |

FOREIGN PATENT DOCUMENTS

EP   0 803 860 B1   5/2003

OTHER PUBLICATIONS

LM387/LM387A Low Noise Dual Preamplifier, Mar. 1987, National Semiconductor, 4 pages.*
Boylestad, Robert L., Introductory Circuit Analysis, Tenth Edition 2002, p. 1124.
Datasheet for AD536A Analog Devices, "Integrated Circuit True RMS-to-DC Converter".

* cited by examiner

*Primary Examiner*—Harry Behm
(74) *Attorney, Agent, or Firm*—Husch Blackwell Sanders Welsh & Katz

(57) ABSTRACT

A half-wave rectifier including an input port for receiving an incoming AC signal, an output port for outputting a half-wave rectified signal, an operational amplifier including inverting and non-inverting input terminals and an output terminal, the inverting input terminal connected to a ground reference and a non-inverting input terminal coupled to a negative feedback loop and a first resistor. The negative feedback loop including a second resistor coupled between a first node and a second node, the first node coupling the output terminal and the output port and the second node coupling the non-inverting input terminal and the second resistor. A capacitor is coupled to the input port and in series with the first resistor.

12 Claims, 3 Drawing Sheets

AC TO DC CONVERSION CIRCUIT

BACKGROUND OF THE INVENTION

1. Field of Invention

The present invention generally relates to the AC to DC conversion and more particularly to a half-wave rectifier circuit not requiring a diode.

2. Description of Prior Art

AC to DC automatic gain control (AGC) utilizing AC to DC conversion is necessary for wireless two-way voice (VOX) and keypad employed in alarm systems for adaptation from the analog domain to the digital domain. AGC circuitry automatically controls the gain of a signal so that weaker signals receive more gain and stronger signals receive less gain or none at all.

There are various methods of achieving AC to DC conversion such as full-wave or half-wave rectifier circuits. AC to DC conversion utilizing a half-wave rectifier provides a circuit that allows only the positive portion or the negative portion of an AC signal to pass, while at the same time blocking out the other portion—thus "clipping" the originally imputed signal.

For Example, FIG. 1 illustrates a conventional half-wave rectifier 100, including an operational amplifier 110, with an AC voltage source ($V_{in}$) inputted to the inverting input 112. The operational amplifier 110 is configured with negative-feedback loop 120, including non-inverting input 114, Node A, and diode 130. A resistor 140 coupled to ground 150 is coupled to the voltage output at Node B which is further coupled to the output of the negative-feedback loop 120 at Node A.

In operation, conventional half-wave rectifier 100 operates in two modes: $V_{in}>0$ and $V_{in}<0$. In the first mode, when $V_{in}$ is greater than zero, output 116 of the operational amplifier 110 will swing positive thereby turning on diode 130. This first mode results in a virtual short where $V_{out}=V_{in}$. In the second mode, when $V_{in}$ is less than zero, output 116 will swing negative thereby resulting in the current through resistor 140 to equal zero. This second mode results is an open circuit between output 116 and Node A. The result of conventional half-wave rectifier 100 swinging back and forth from positive to negative is a "clipping" of the negative trough from the input sine wave signal.

The disadvantage of utilizing a diode in a half-wave rectifier is that low-level signals below the conduction level of a diode (<0.6 volts for silicon diodes or 0.2 volts for germanium) cannot pass through the half-wave rectifier circuit. Hence, there is a need for an AC to DC converter utilizing a half-wave rectifier without a diode.

SUMMARY OF THE INVENTION

In an embodiment of the present invention, an AC to DC converter is provided including a half-wave rectifier provided for half-wave rectifying AC signals that are less than approximately 0.75 volts AC to realize a output signal that is approximately half of the average AC value of the AC signal without utilizing a diode. The half-wave rectifier includes an input port for receiving an incoming AC signal, an output port for outputting the half-wave rectified signal and an operational amplifier including two input terminals and an output terminal. The input terminals are an inverting input terminal connected to a ground reference and a non-inverting input terminal coupled to a negative feedback loop and a first resistor. The negative feedback loop includes a second resistor coupled between a first node and a second node, the first node coupling the output terminal and the output port and the second node coupling the non-inverting input terminal and the second resistor. The half-wave rectifier also includes a capacitor coupled to the input port and in series with the first resistor. The half-wave rectifier provides AC to DC conversion utilizing a half-wave rectifier circuit not requiring a diode.

In accordance with another embodiment of the present invention the operational amplifier is a dual preamplifier.

In accordance with another embodiment of the present invention, low-level signals below the conduction level of a diode (<0.6 volts for silicon diodes or 0.2 volts for germanium) can pass through the half-wave rectifier.

The dual preamplifier output terminal on a negative swing clips-out each incoming AC signal, with the remaining signal half-wave rectified so that an average DC value corresponding to ½ the average AC value is outputted.

The half-wave rectifier does not include a diode in the negative feedback path for extending the dynamic range of rectification.

The half-wave rectifier of the present invention increases the accuracy range of VOX detection in a home or corporate security system and at the same time reducing the costs associated with AGC circuits.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION OF THE INVENTION

Figure 3:
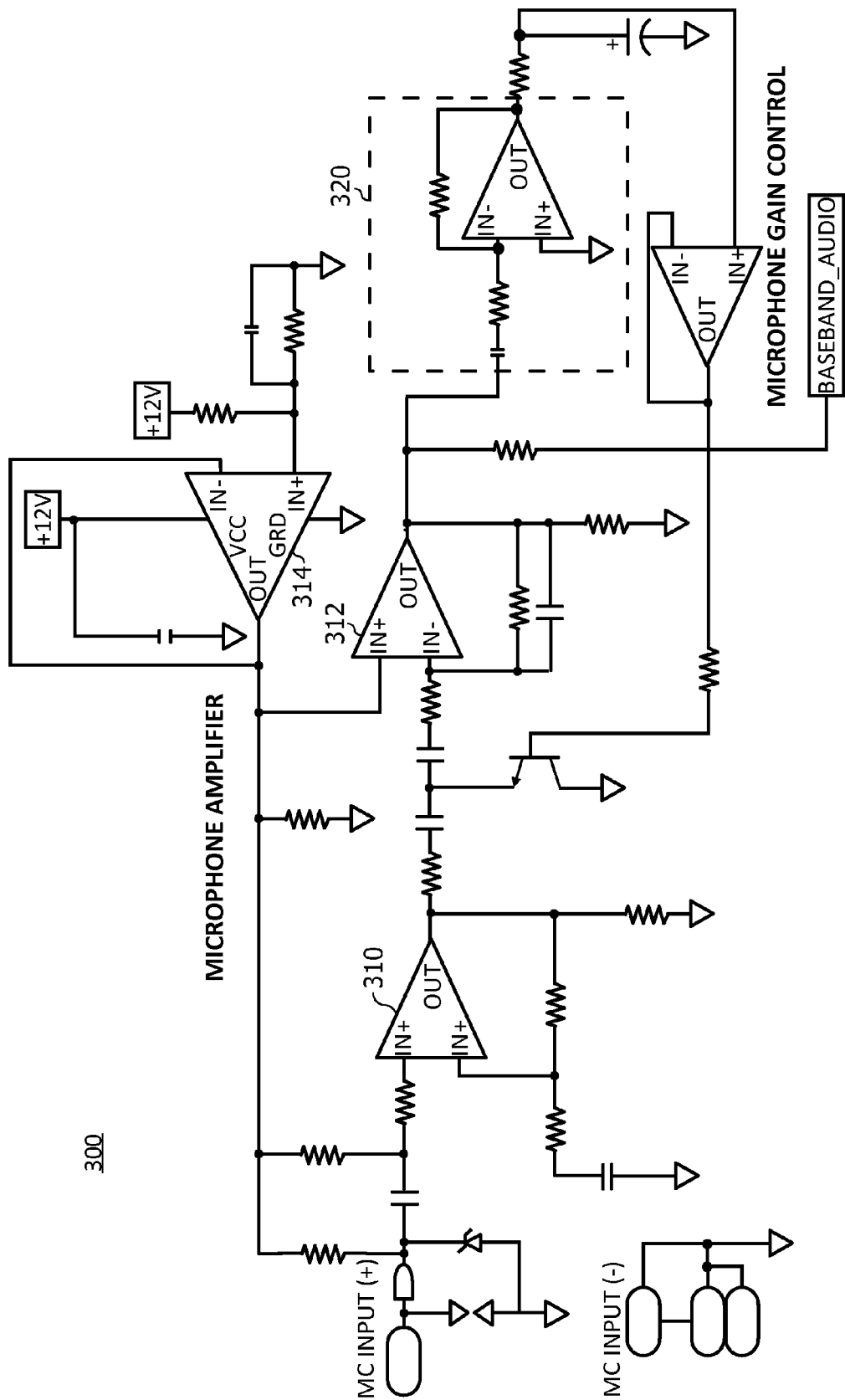
FIG. 3 is a half-wave rectifier providing automatic gain control according to one embodiment of the present invention.

FIG. 3 is a schematic example of providing an AC to DC conversion circuit in a wireless two-way voice (VOX) circuit, according to one embodiment of the present invention. As can be seen in FIG. 3 audio signals input from a microphone at terminals MIC INPUT (+) and MIC INPUT (−) are amplified by a first amplifier 310, a second amplifier 312, and a third amplifier 314. An automatic gain control circuit 320 is provided in the wireless two-way voice (VOX) circuit 300 to provide improved microphone gain control.

Figure 1:
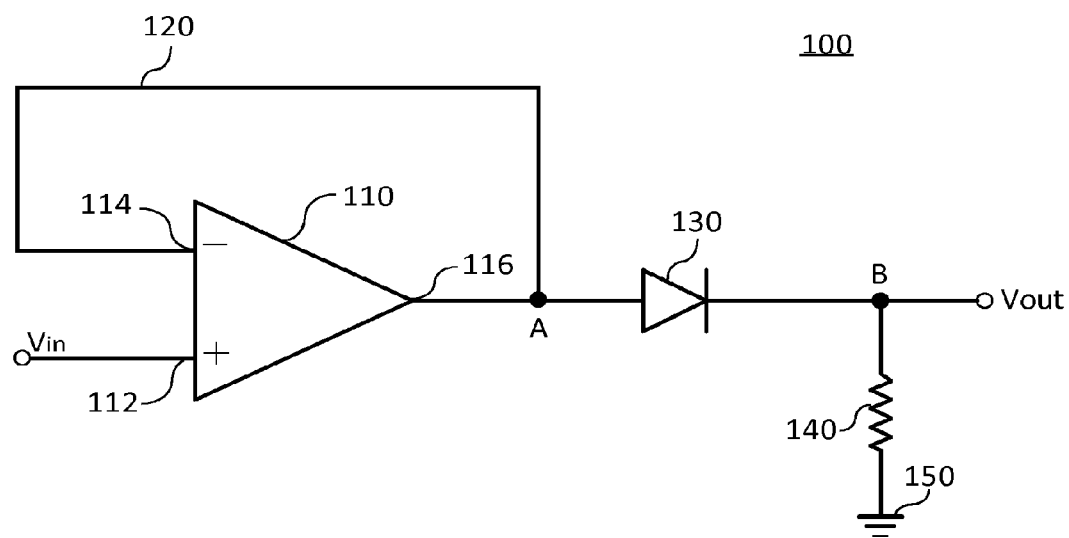
FIG. 1 is an illustration of a conventional half-wave rectifier circuit utilizing a diode.
Figure 2:
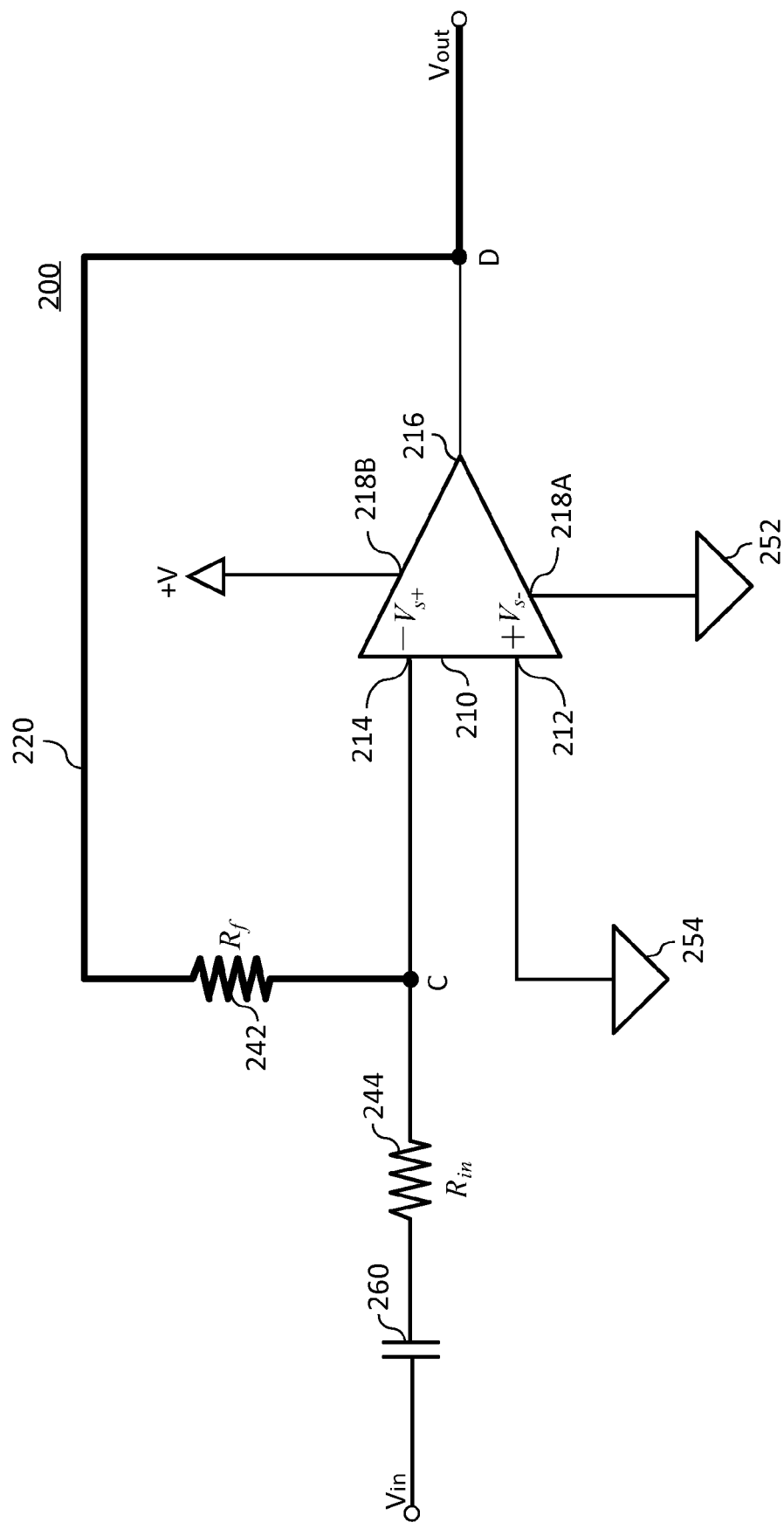
FIG. 2 is a schematic example of providing automatic gain control in a wireless two-way voice (VOX) circuit according to one embodiment of the present invention.

FIG. 2 is an illustration of a half-wave rectifier not including a diode 200 according to one embodiment of the present invention. As can be seen in FIG. 2, an operational amplifier 210 is shown with its non-inverting input coupled to ground 254. $V_{in}$ is inputted to capacitor 260 which is coupled to resistor, $R_{in}$ 244. A negative-feedback loop 220 includes resistor $R_f$ 242 and is formed between Nodes C and D. Output 216 of the operational amplifier 210 is coupled to Node D and $V_{out}$. The operational amplifier is powered at pins $V_{s+}$ 218B and $V_{s-}$ 218A.

In another embodiment, the operational amplifier could be a dual preamplifier such as a LM387/LM387A Low Noise Dual Preamplifier implemented without departing from the scope of this invention, as will be understood by those skilled in the art.

Operationally, the half-wave rectifier circuit 200 provides that an incoming AC signal $V_{in}$ is amplified to $R_f/R_{in}$ (resistors 242 and 244). The operational amplifier 210 outputs a negative swing, which is clipped out, and the remaining signal is a half-wave rectified signal that has an average DC value corresponding to ½ the average AC value. Since no diode is placed in the negative feedback path, the dynamic range of rectification is extended. Hence, low-level signals below the conduction level of a diode (<0.6 volts for silicon diodes or 0.2 volts for germanium) can pass through the half-wave rectifier providing automatic gain control.

FIG. 3 is a schematic example of providing an AC to DC conversion circuit in a wireless two-way voice (VOX) circuit, according to one embodiment of the present invention. As can be seen in FIG. 3 audio signals input from a microphone at terminals MIC INPUT (+) and MIC INPUT (−) are amplified by a first amplifier 310, a second amplifier 312, and a third amplifier 314. An automatic gain control circuit 320 is provided in the wireless two-way voice (VOX) circuit 300 to provide improved microphone gain control.

Therefore, the present invention, as described above, provides a novel, inexpensive AC to DC converter for use in wireless two-way voice (VOX) and keypad employed in alarm systems for adaptation from the analog domain to the digital domain. In addition, the present invention provides an AC to DC conversion utilizing automatic gain control (AGC) for a half-wave rectifier circuit not requiring a diode. By not requiring a diode the half-wave rectifier allows low level signals to pass through the half-wave rectifier circuit to, for example increase the accuracy range of VOX detection in a home or corporate security system and at the same time reducing the costs associated with AGC circuits.

While there has been shown and described what is considered to be preferred embodiments of the invention, it will, of course, be understood that various modifications and changes in form or detail could readily be made without departing from the spirit of the invention. It is therefore intended that the scope of the invention not be limited to the exact forms described and illustrated, but should be construed to cover all modifications that may fall within the scope of the appended claims.

What is claimed is:

1. A half-wave rectifier circuit, comprising:
   an input port for receiving an incoming AC signal;
   an output port for outputting a half-wave rectified signal;
   a operational amplifier including inverting and non-inverting input terminals and an output terminal, said non-inverting input terminal and a negative polarity power supply input of said operational amplifier being coupled directly to a ground reference and said inverting input terminal being coupled to a first resistor;
   a negative feedback loop including a second resistor coupled between a first node and a second node, the first node coupling said output terminal and said output port and the second node coupling said inverting input terminal and said second resistor; and
   a capacitor coupled to the input port and in series with said first resistor wherein said half-wave rectifier circuit operates without a diode.

2. The half-wave rectifier of claim 1, wherein the incoming AC signal is amplified by the second resistor divided by the first resistor.

3. The half-wave rectifier of claim 1, wherein the operational amplifier is a dual preamplifier.

4. The half-wave rectifier of claim 1, wherein low-level signals below the conduction level of a diode can pass through the half-wave rectifier.

5. The half-wave rectifier of claim 3, wherein the dual preamplifier output terminal on a negative swing clips-out each incoming AC signal, with the remaining signal half-wave rectified so that an average DC value corresponding to ½ the average AC value is outputted.

6. The half-wave rectifier of claim 4, wherein signals below 0.75 volts can pass through the half-wave rectifier.

7. A wireless two-way voice (VOX) and keypad device including a half-wave rectifier circuit, comprising:
   an input port for receiving an incoming AC signal;
   an output port for outputting a half-wave rectified signal;
   a operational amplifier including inverting and non-inverting input terminals and a output terminal, said non-inverting input terminal and a negative polarity power supply input of said operational amplifier being coupled directly to a ground reference and said inverting input terminal being coupled to a first resistor;
   a negative feedback loop including a second resistor coupled between a first node and a second node, the first node coupling said output terminal and said output port and the second node coupling said inverting input terminal and said second resistor; and
   a capacitor coupled to the input port and in series with said first resistor wherein the wireless two-way (VOX) and keypad device operates without a diode.

8. The half-wave rectifier of claim 7, wherein the incoming AC signal is amplified by the second resistor divided by the first resistor.

9. The device of claim 7, wherein the operational amplifier is a dual preamplifier.

10. The half-wave rectifier of claim 7, wherein low-level signals below the conduction level of a diode can pass through the half-wave rectifier.

11. The half-wave rectifier of claim 9, wherein the dual preamplifier output terminal on a negative swing clips-out each incoming AC signal, with the remaining signal half-wave rectified so that an average DC vale corresponding to ½ the average AC value is outputted.

12. The half-wave rectifier of claim 10 wherein signals below 0.75 volts can pass through the half-wave rectifier.

* * * * *